455-619 AU 233 EX
FIP8106 XR 3,223,938
neutralization
[redacted]

XR-330-40X

EMITTER FOLLOWER TRANSISTOR AMPLIFIER

Filed May 11, 1962

INVENTOR
JAMES E. BROOK
BY
ATTORNEY 3,223,938

EMITTER FOLLOWER TRANSISTOR AMPLIFIER

James E. Brook, Maywood, N.J., assignor to The Bendix Corporation, Teterboro, N.J., a corporation of Delaware Filed May 11, 1962, Ser. No. 194,006
11 Claims. (Cl. 330—32)

The invention relates generally to electrical circuits and in particular to emitter follower type circuits.

In many applications of electrical engineering, it is necessary to have a circuit providing a high input impedance and low output impedance. In some applications, the capacitance of the source itself must be compensated or eliminated.

An element requiring such a circuit is a photodiode operating at high frequencies. A photodiode is a high resistance device which changes resistance in accordance with applied light signals. Usually, a D.C. potential is impressed on one terminal, and an output current in accordance with the light signals appears at the other terminal. Because the diode is a high resistance device, for example of 1000 megohms, the output current signal should, for best results, be applied to a high input impedance amplifier. A further problem is that the photodiode has an equivalent internal capacitance in the order of a few picafarads. Thus, for a high frequency light signal, for example of one megacycle, the internal capacitance causes diminution and distortion of the high frequency alternating current that flows from the photodiode. To provide a high input impedance and to compensate for the capacitive effect, the circuit of the invention is used.

Because of the capacitive effect, photodiodes—and other photoelectric devices were heretofore usually operated at low frequencies. When it was desired or necessary to extend a photoelectric device's range into higher frequencies, the intensity of light signal had to be greatly increased. Thus, the invention includes a circuit for extending the response of a photoelectric device into the high frequency range without the use of high intensity light signals.

An object of the present invention is to provide a novel circuit having a high input impedance.

Another object of the invention is to provide a novel circuit having high input impedance, low output impedance, a gain not exceeding unity, and feedback means to compensate for capacitance of an input signal source.

Another object of the invention is to provide a novel high input impedance amplifier operable at high frequencies.

Another object of the invention is to provide a novel high input impedance amplifier capable of compact packaging and avoiding the use of a power source floating within the circuit.

Another object of the invention is to provide a novel circuit for use with a photoelectric device for extending the usable frequency response of the device.

Another object of the invention is to provide a novel circuit for use with a photodiode for improving the high speed transient response of the photodiode.

The invention contemplates a circuit including a photoelectric device and an amplifier having a high input impedance and including means to compensate for any capacitive effects of the device, thus improving the frequency response of the photoelectric device. The invention also contemplates a novel circuit providing a high input impedance at an input terminal and a low output impedance at an output terminal and having a gain less than unity, and has a first transistor having a base connected to the input terminal, a collector, and an emitter; means for biasing the first transistor; a second transistor having a base capacitively coupled to the emitter of the first transistor, a collector connected to a source of potential, and an emitter connected to the collector of the first transistor; means for biasing the second transistor; a pair of resistors serially connected between the emitter of the first transistor and a reference potential and connected to the output terminal at a junction of the two resistors; and a capacitor coupling the emitter of the second transistor to the junction of the two resistors.

The foregoing and other objects and advantages of the invention will appear more fully hereinafter from a consideration of the detailed description which follows, taken together with the accompanying drawings wherein two embodiments of the invention are illustrated by way of example. It is to be expressly understood, however, that the drawings are for illustration purposes only and are not to be construed as defining the limits of the invention.

Figure 1:
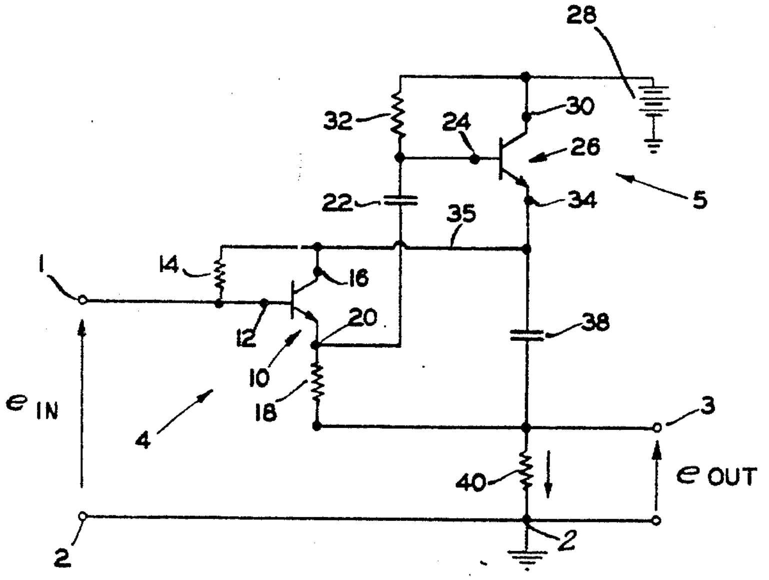
FIGURE 1 is a schematic drawing of a novel compounded emitter follower circuit constructed in accordance with the invention.

The novel compounded emitter follower circuit constructed in accordance with the invention and shown in FIGURE 1 provides a high input impedance between an input terminal 1 and a reference potential 2; a low output impedance between an output terminal 3 and reference potential 2; and an overall gain not exceeding unity. The circuit includes two emitter follower stages 4 and 5.

In first stage 4, a transistor 10 is arranged with a base 12 connected to input terminal 1 for receiving an input signal, a resistor 14 connected between base 12 and a collector 16 to provide bias, and a load resistor 18 connected between an emitter 20 and output terminal 3. Base 12 may be considered the input terminal, emitter 20 the output terminal, and the end of resistor 18 that joins terminal 3 the reference terminal for the emitter follower 4.

The second emitter follower stage 5 comprises a transistor 26 having a base 24 connected through a coupling capacitor 22 to emitter 20 for receiving an input signal from the first stage, a collector 30 connected to a source of potential 28 for receiving power, an emitter 34 at which is provided an output signal, and a load resistor 40 across which is developed the output signal of the second stage. The resistor 40 is connected between output terminal 3 and reference potential 2, and is connected to and receives the output signal from emitter 34 through a capacitor 38. The compounded configuration of the two transistor stages is effected by the arrangement of the first emitter stage 4 with respect to resistor 40 of the second emitter stage 5. With this arrangement, the first emitter stage 4 uses as a reference potential the output of the second emitter stage 5 across resistor 40.

The power supply 28, in addition to providing power to stage 5, provides a bias potential to base 24 through a resistor 32 to bias transistor 26 in a conducting state.

Power supply 28 also provides power to first emitter stage 4. A D.C. component passes from supply 28 through transistor 26 from collector 30 to emitter 34 through a conductor 35 to collector 16 of transistor 10. Capacitor 38 connecting emitter 34 to terminal 3 maintains an electrical potential across first emitter follower stage 4.

The base 24 may be considered an input terminal, collector 30 a power terminal, emitter 34 an output terminal, and the end of resistor 40 that joins ground 2 as a reference terminal of the second emitter follower 5.

The signal flow in the circuit may be traced as follows. An input signal, at input terminal 1, is applied to base 12 of transistor 10. A proportional signal is then applied from emitter 20 through coupling capacitor 22 to base 24 of transistor 26, an output signal appearing at emitter 34 passes through capacitor 38 and appears at output terminal 3 across the load resistor 40.

The distribution of D.C. power in the circuit may be traced as follows. A potential from source 28 is applied directly to collector 30. A D.C. component passes through transistor 26 from collector 30 to emitter 34 and is then applied via conductor 35 to the power terminal (collector 16) of the first emitter follower. A steady potential is maintained across the first emitter follower by storage capacitor 38. It should be noted that with this arrangement, only a single power source is required and a floating power supply for the first emitter follower is avoided.

In summary, FIGURE 1 shows a compounded emitter follower having a high input impedance and a low output impedance that has a simple design, capable of compact packaging and that does not require a floating power supply.

Figure 2:
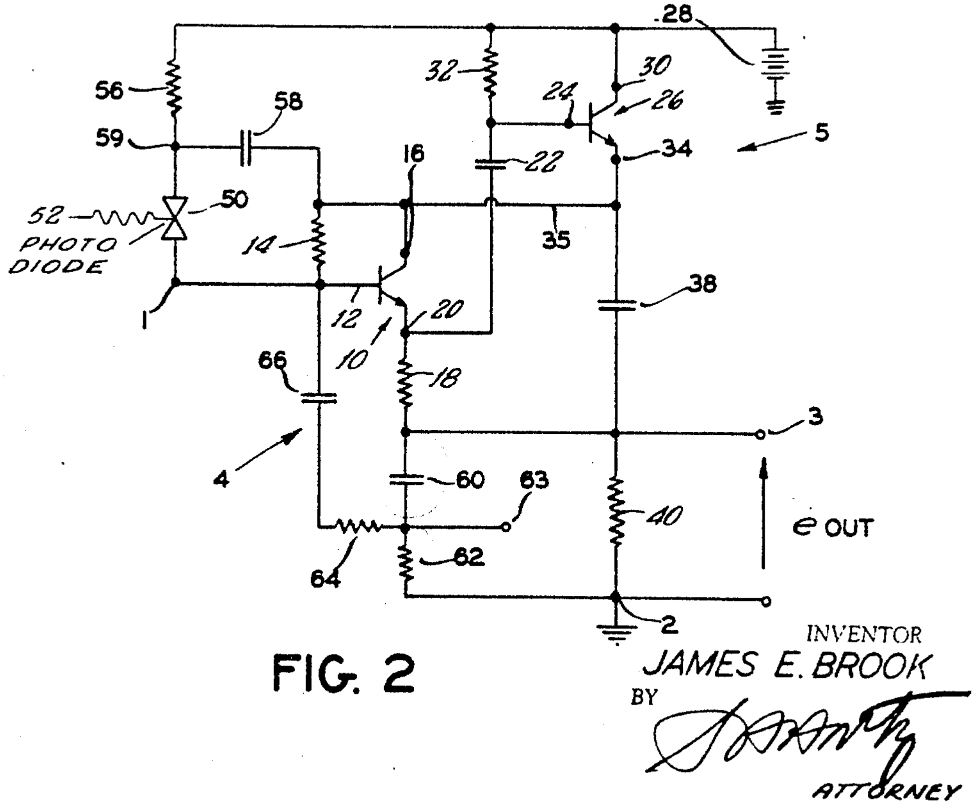
FIGURE 2 is a schematic drawing of the circuit of FIGURE 1 with a photodiode and feedback means for compensating for capacitive effects of the photodiode.

In the schematic drawing of FIGURE 2, there is shown the compound emitter follower of FIGURE 1, a photodiode, and two compensation networks for improving the frequency response of the photodiode. Like elements in FIGURES 1 and 2 bear like legends.

Referring to FIGURE 2, a photodiode 50 of the type that changes resistance in accordance with an applied light signal 52 is connected between input terminal 1 and power supply 28. A protecting resistor 56 is connected in series with photodiode 50 to limit the amount of current through photodiode 50.

The circuit as described, to this point, presents a high impedance to photodiode 50 at terminal 1, but does not compensate for any equivalent capacitance of photodiode 50. For a high frequency light signal 52, the circuit so far described produces an output signal at terminal 3 having a staircase effect. To compensate for the photodiode's capacitance, and the resultant staircase effect in an output signal, two compensating networks are added.

First, a capacitor 58 is connected between emitter 34 and a junction 59 of photodiode 50 with resistor 56. Capacitor 58 applies an output of the emitter follower to the excitation side 59 of photodiode 50 thereby neutralizing the photodiode's capacitance. This may be termed "boot-strapping."

Second, a feedback network including a rate circuit, comprising a capacitor 60 serially connected with a resistor 62, is connected between output terminal 3 and ground 2. The rate circuit provides at a junction 63 between capacitor 60 and resistor 62 a signal proportional to the derivative of any output signal at terminal 3. A series connected current limiting resistor 64 and a blocking capacitor 66 between junction 63 and input terminal 1 feedback the derivative signal to input terminal 1. Thus when a signal from photodiode 50 passes through a maximum, the applied derivative signal dissipates any energy stored in the excess minority carriers of photodiode 50.

A secondary output may be taken from the circuit at junction 63. This output is equal to the derivative of the signal available at terminal 3.

In summary, there is shown in FIGURE 2, a circuit having a high input impedance, a first bootstrap feedback path, and a second derivative feedback, used in conjunction with a photoelectric diode for extending the frequency response of the device.

There are many different values of the circuit parameters shown in FIGURE 2 for which the circuit will function satisfactorily. Since the circuit parameters may vary according to the design for any particular application, the following circuit parameters are included for the circuit of FIGURE 2 by way of example only:

Transistors 10 and 26: TNT841.
Bias resistors 32 and 14: 1 meg ohm.
Current protecting resistor 56: 100,000 ohms.
Feedback resistor 64: 220,000 ohms.
Load resistor 18 and 40: 4700 ohms.
Rate circuit resistor 52: 2200 ohms.
Coupling capacitor 22: 300 pica farads.
Storage capacitor 38: 1 micro farad.
Blocking capacitor 58 and rate capacitor 60: 220 pica farads.
Power supply source: +40 volts.
Photodiode 50: 1N2175.

While two embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. An emitter follower comprising a first transistor having a base adapted to receive a signal, a collector and an emitter, means connected between the base and collector for biasing the first transitor, a source of electrical potential, a second transistor having a base capacitively coupled to the emitter of the first transistor, a collector connected to the source of potential and an emitter connected directly to the collector of the first transistor to provide power to the first transistor, means connected between the base and collector for biasing the second transistor, a reference potential, a pair of resistors serially connected between the emitter of the first transistor and the reference potential for providing a signal at a junction of the two resistors, and means coupling the emitter of the second transistor to the junction of the two resistors for maintaining a direct current potential across the first transistor.

2. An emitter follower circuit having a high input impedance and a low output impedance comprising first and second emitter followers each having a transistor, an input terminal, a power terminal, an output terminal, and a reference terminal, the output terminal of the second emitter follower being connected directly to the power terminal of the first emitter follower, a capacitor connecting the output terminal of the first emitter follower to the input terminal of the second emitter follower, power supply means connected to the power terminal of the second emitter follower, load means connected between the output terminal and the reference terminal of the first emitter follower and between the reference terminal of the first emitter follower and the reference terminal of the second emitter follower, and capacitive means connecting the output terminal of the second emitter follower to the reference terminal of the first emitter-follower, a high input impedance being provided between the input terminal of the first emitter follower and the reference terminal of the second emitter follower, and a low output impedance being provided across the load means of the second emitter follower.

3. An emitter follower presenting a high input impedance at an input terminal and presenting a low output impedance at an output terminal and providing a gain less than unity comprising, a first transistor having a base connected to the input terminal and adapted to receive an input signal, an emitter for providing an emitter signal, and a collector for receiving power, means for biasing the transistor including a resistor connecting the collector to the base, a reference potential, a series connection of two resistors joining the emitter to the reference potential and connected to the output terminal at a junction of the two resistors, a second transistor having a base capacitively connected to the emitter of the first transistor for receiving the emitter signal, a collector for receiving power, and an emitter for providing an output signal, a source of electrical potential connected to the collector of the second transistor for applying power, direct coupling means connecting the emitter of the second transistor to the collector of the first transistor for applying direct current power to the first transistor, and a capacitor connecting the emitter of the second transistor to the junction of the two resistors for applying the output signal from the second transistor to the output terminal, and for maintaining a potential across the first transistor.

4. An electrical circuit comprising an emitter follower having an input terminal, an output terminal, a terminal for receiving power, and a reference terminal, load means connected between the output terminal and the reference terminal, a source of electrical potential, a transistor having a base coupled to the output terminal of the emitter follower for receiving a signal therefrom, a collector connected to the source of electrical potential, and an emitter connected directly to the power terminal of the emitter follower, means connected between the base and collector for biasing the transistor, capacitive means coupling the emitter to the reference terminal of the emitter follower, a reference potential, load means including a resistor connecting the reference terminal to the reference potential, said capacitive means conducting alternating signals from the emitter to provide an output signal across the last mentioned load means.

5. A circuit for improving high speed transient response of a photo diode comprising a two terminal photo diode, a source of electrical potential applied to one terminal, a first transistor having a base connected to the second terminal, and a collector capacitively connected to the first terminal, and an emitter, biasing means including a resistor connecting the collector to the base, a second transistor having a base capacitively coupled to the emitter of the first transistor and a collector connected to the source of potential and an emitter connected to the collector of the first transistor, means for biasing the second transistor including a resistor between the source and the base of the second transistor, a reference potential, a pair of resistors serially connected between the emitter of the first transistor and the reference potential and providing a first output terminal at a junction of the two resistors, a capacitor coupling the emitter of the second transistor to the junction of the two resistors, a derivative feedback network including a capacitor and a resistor serially connected between the output terminal and the reference potential and providing a second output at their junction, and a second series connection of resistor and capacitor connecting the latter junction to the base of the first transistor.

6. A circuit for improving high speed transient response of a photo diode having first and second terminals, a source of electrical potential applied to the first terminal, a first transistor having a base connected to the second terminal, a collector and an emitter, a second transistor having a base coupled to the emitter of the first transistor, a collector connected to the source of potential and an emitter connected to the collector of the first transistor, a capacitor connecting the emitter of the second transistor to the first terminal to neutralize the capacitance of the photo diode, a reference potential, a pair of resistors serially connected between the emitter of the first transistor and the reference potential and providing an output across one of the resistors, and a capacitor coupling the emitter of the second transistor to a junction of the two resistors.

7. A circuit for improving high speed transient response of a photo diode having first and second terminals, a source of electrical potential applied to the first terminal, a first transistor having a base connected to the second terminal, a collector and an emitter, a second transistor having a base coupled to the emitter of the first transistor, a collector connected to the source of potential and an emitter connected to the collector of the first transistor, a reference potential, a pair of resistors serially connected between the emitter of the first transistor and the reference potential and providing a first output terminal at a junction of the two resistors, a capacitor coupling the emitter of the second transistor to the junction of the two resistors, a derivative feedback network including a capacitor and a resistor serially connected between the output terminal and the reference potential and providing a second output at their junction, and a second series connection of resistor and capacitor connecting the latter junction to the base of the first transistor.

8. A circuit for improving high speed transient response of a photo diode, comprising a source of electrical potential connected to the photo diode, a first transistor having a base connected to the photo diode, a collector and an emitter, a second transistor having a base connected to the emitter of the first transistor, a collector connected to the source of potential and an emitter connected to the collector of the first transistor, a capacitor connecting the emitter of the second transistor to the photo diode to neutralize the capacitance of the photo diode, a reference potential, a pair of resistors serially connected between the emitter of the first transistor and the reference potential and providing a first output across one of the resistors, a capacitor coupling the emitter of the second transistor to a junction of the two resistors, a derivative network connected across said one resistor, and feedback means connecting the derivative network to the photo diode and to the base of the first transistor to dissipate energy stored in the photo diode.

9. A circuit for extending the usable frequency response of a photo-electric device, comprising first and second emitter followers capacitatively coupled together, a power connection between the second emitter follower and the first emitter follower, a capacitor connecting the second emitter follower to the photo-electric device for neutralizing the capacitance of the photo-electric device, load means connected to the first and second emitter followers, an output connected across the load means of the second emitter follower, means responsive to the output for providing an electrical signal corresponding to the first derivative of the output, and feedback means connecting the last-mentioned means to the photo-electric device for applying the derivative signal to the photo-electric device to dissipate energy stored in the photo-electric device.

10. A circuit for extending the usable frequency response of a photo-electric device, comprising first and second emitter followers, a capacitive connection between the first emitter follower and the second emitter follower, load means connected to the first and second emitter followers, means connected across the load means of the second emitter follower for providing an output, means connected across the load means of the second emitter follower for providing an electrical signal corresponding to the first derivative of the output, and feedback means connecting the last-mentioned means to the photo-electric device for applying the derivative signal to the photo-electric device to dissipate energy stored in the photo-electric device.

11. In a circuit of the kind described, first and second emitter followers capacitatively coupled together, a power connection between the second emitter follower and the first emitter follower, a photo diode, a capacitor connecting the second emitter follower to the photo diode for neutralizing the capacitance of the photo diode, load means connected to the first and second emitter followers, means connected across the load means of the second emitter follower for providing an output, means responsive to the output for providing an electrical signal corresponding to the first derivative of the output, and feedback means connecting the last-mentioned means to the photo diode to dissipate energy stored in the photo diode.

References Cited by the Examiner

UNITED STATES PATENTS

| | | | |
|---|---|---|---|
| 2,858,379 | 10/1958 | Stanley | 330—22 X |
| 2,950,443 | 8/1960 | Davidson et al. | 330—156 X |
| 3,053,985 | 9/1962 | Grammer et al. | 250—212 |

FOREIGN PATENTS

| | | |
|---|---|---|
| 550,327 | 12/1957 | Canada. |
| 882,294 | 11/1961 | Great Britain. |

ROY LAKE, *Primary Examiner.*

NATHAN KAUFMAN, *Examiner.*